United States Patent
Lee et al.

(10) Patent No.: US 11,018,474 B2
(45) Date of Patent: May 25, 2021

(54) LASER TEMPERATURE COMPENSATION SYSTEM AND DRIVING METHOD THEREOF

(71) Applicant: OPTELLA INC., Gwangju (KR)

(72) Inventors: Sangsoo Lee, Gwangju (KR); Jaeho Song, Gwangju (KR)

(73) Assignee: OPTELLA INC., Geangju (KR)

( * ) Notice: Subject to any disclaimer, the term of this patent is extended or adjusted under 35 U.S.C. 154(b) by 146 days.

(21) Appl. No.: 16/206,048

(22) Filed: Nov. 30, 2018

(65) Prior Publication Data

US 2020/0176950 A1 Jun. 4, 2020

(51) Int. Cl.
| | |
|---|---|
| *H01S 5/0625* | (2006.01) |
| *H01S 5/026* | (2006.01) |
| *H04B 10/50* | (2013.01) |
| *H01S 5/06* | (2006.01) |
| *H01S 5/062* | (2006.01) |

(52) U.S. Cl.
CPC .......... *H01S 5/0612* (2013.01); *H01S 5/0261* (2013.01); *H01S 5/06253* (2013.01); *H04B 10/504* (2013.01); *H01S 5/0617* (2013.01); *H01S 5/06246* (2013.01); *H01S 5/06256* (2013.01)

(58) Field of Classification Search
CPC .. H01S 5/0612; H01S 5/0261; H01S 5/06253; H01S 5/06256; H01S 5/06246; H01S 5/0617; H01S 5/06804; H01S 5/0265; H01S 5/02453; H04B 10/504
See application file for complete search history.

(56) References Cited

U.S. PATENT DOCUMENTS

| | | | |
|---|---|---|---|
| 6,631,146 B2 | 10/2003 | Pontis et al. | |
| 7,480,317 B2 | 1/2009 | Hu et al. | |
| 7,505,694 B2 | 3/2009 | Johnson et al. | |
| 8,532,153 B2 | 9/2013 | Zheng et al. | |
| 9,246,307 B1 | 1/2016 | Yan et al. | |
| 9,537,287 B2 | 1/2017 | Yan et al. | |

(Continued)

FOREIGN PATENT DOCUMENTS

| | | |
|---|---|---|
| KR | 20040015331 A | 2/2004 |
| KR | 20090068268 A | 6/2009 |
| KR | 20170060147 A | 5/2017 |

OTHER PUBLICATIONS

Hamutal Shalom et al., "On the Various Time Constants of Wavelength Changes of a DFB Laser Under Direct Modulation", IEEE Journal of Quantum Electronics, vol. 34, No. 10 (Oct. 1998).

(Continued)

*Primary Examiner* — M. A. Golub-Miller
(74) *Attorney, Agent, or Firm* — Dilworth & Barrese, LLP.; Michael J. Musella, Esq.

(57) ABSTRACT

An optical transmitter and a method for driving the optical transmitter include emitting an optical signal using a laser having a lasing cavity with a first section and a second section, performing, using a first heater thermally coupled to the first section, a first temperature control on the first section using a first control signal, and performing, using a second heater thermally coupled to the second section, a second temperature control on the second section using a second control signal. The first temperature control is independent from the second temperature control.

6 Claims, 8 Drawing Sheets

(56) References Cited

U.S. PATENT DOCUMENTS

| | | | | | |
|---|---|---|---|---|---|
| 2004/0066812 | A1* | 4/2004 | Nagano | | H01S 5/02453 372/34 |
| 2005/0053103 | A1* | 3/2005 | Lo | | H04B 10/504 372/20 |
| 2005/0249509 | A1* | 11/2005 | Nagarajan | | H01S 5/024 398/198 |
| 2007/0110453 | A1* | 5/2007 | Akiyama | | G02B 6/12004 398/182 |
| 2008/0063016 | A1* | 3/2008 | Bhatia | | H01S 5/0612 372/34 |
| 2009/0097863 | A1* | 4/2009 | Oomori | | H04B 10/508 398/186 |
| 2013/0322472 | A1* | 12/2013 | Li | | H01S 5/141 372/20 |
| 2015/0078411 | A1* | 3/2015 | Bismuto | | H01S 5/2275 372/44.01 |
| 2015/0295385 | A1* | 10/2015 | Wang | | H01S 5/06253 398/79 |
| 2016/0276803 | A1* | 9/2016 | Uesaka | | H01S 5/02256 |
| 2018/0323578 | A1* | 11/2018 | He | | H01S 3/105 |
| 2020/0213010 | A1* | 7/2020 | Kim | | H04B 10/572 |

OTHER PUBLICATIONS

Doutje van Veen et al., "Measurement and Mitigation of Wavelength Drift due to Self-Heating of Tunable Burst-Mode DML for TWDM-PON", OFC 2014, W1D.6.

Yasuhiro Matsui et al., Transceiver for NG-PON2: Wavelength Tunability for Burst Mode TWDM and Point-to-Point WDM, OFC 2016, Tu2C.1.

Xuming Wu et al., Suppression of Burst-Mode Operation Induced Laser Wavelength Drift for Upstream Transmission in TWDM-PON by Using an Integrated Heater for Thermal Control, OFC 2017, Tu3G.1.

* cited by examiner

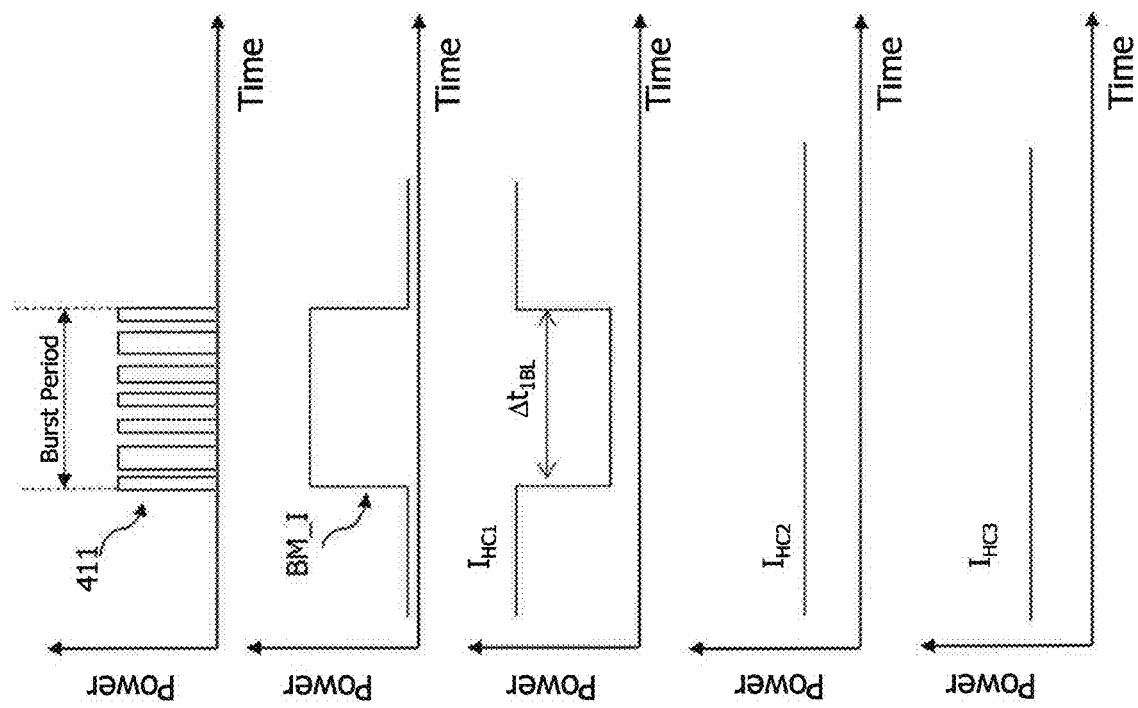

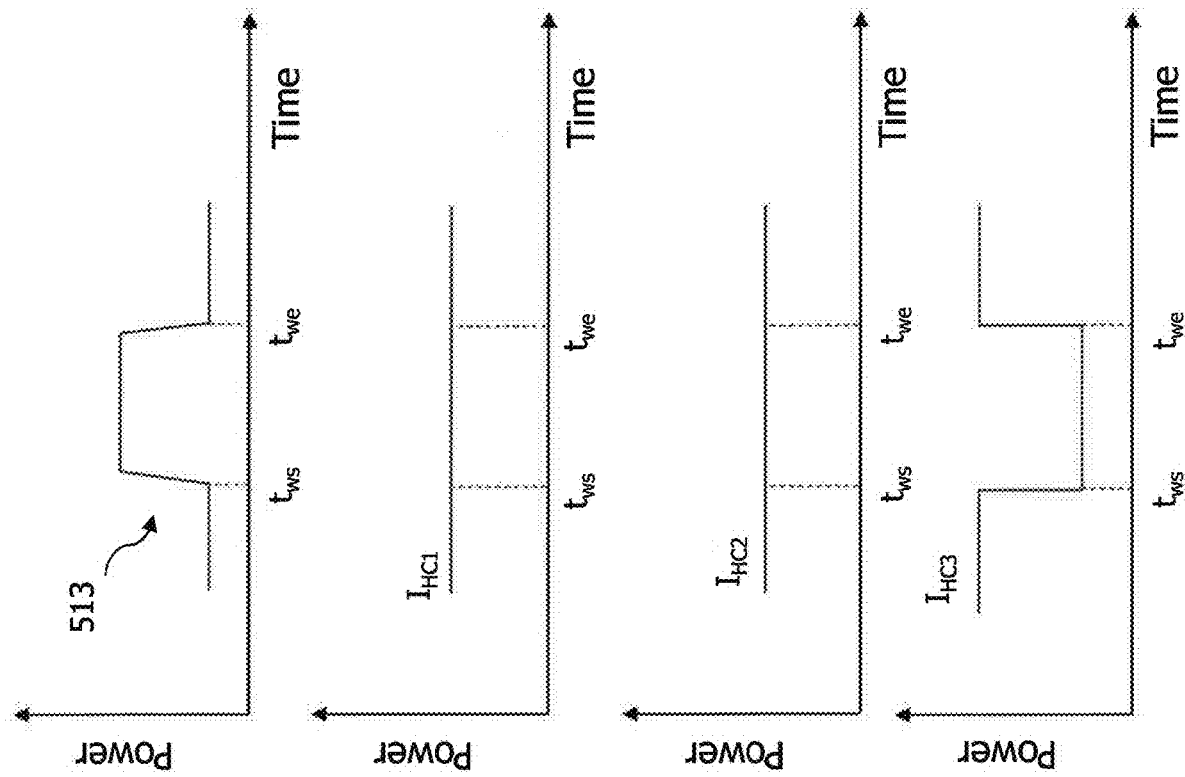

LASER TEMPERATURE COMPENSATION SYSTEM AND DRIVING METHOD THEREOF

FIELD

The present disclosure relates to an optical communication system, and more particularly to an optical transmitter with a laser temperature compensation system.

BACKGROUND

Due to advantages such as low cost, small size, and low power-consumption, optical transmitters based on a directly modulated laser have extensively been developed. However, a thermal frequency chirp generated due to temperature variation of a laser causes various detrimental effects on an optical communication link such as a wavelength drift-induced crosstalk penalty, a chirp penalty, etc. For example, a laser can be self-heated when it is modulated according to a burst data stream (e.g., burst-mode data signal). The thermal frequency chirp is caused due to temperature-dependency of a refractive index in a lasing cavity (e.g., active region). The change in refractive index of the lasing cavity results in change in effective optical length of the cavity, thus changing a lasing wavelength of the laser. To compensate for the thermal frequency chirp of a laser, various methods using: a heat management via a laser bias control, a single heater embedded on a laser, feed forward-based thermal chirp compensation circuit have been developed.

However, none of the prior methods can provide precise and delicate temperature compensations for a laser with a lasing cavity including different multiple sections such as a distributed Bragg reflector (DBR) laser. The cavity of a laser can be heated when injection currents are increased because of various laser heat generation events such as receipt of a burst data stream, occurrence of a wavelength tuning, etc. If a laser has a multi-sectioned cavity, each section is heated differently from another section due to the above-mentioned laser heat generation events. Thus, use of a single heater creates problems when attempting to precisely control the temperature of a laser with a multi-sectioned cavity using a single heater.

Thus, there is need for a new laser temperature compensation method or system allowing more precise thermal control on a laser with a multi-sectioned cavity.

SUMMARY

In one aspect there is provided an optical transmitter. The optical transmitter includes a light source configured to emit an optical signal, a lasing cavity of the light source including a first section and a second section. The transmitter further includes a first heater thermally coupled to the first section and a second heater thermally coupled to the second section. The first heater is configured to perform a first temperature control on the first section using a first control signal. The second heater is configured to perform a second temperature control on the second section using a second control signal. The first temperature control is independent from the second temperature control.

In one embodiment, the light source is configured to emit the optical signal during a burst period of an electrical data signal, and the first section is an active gain section configured to modulate light of the light source according to the electrical data signal and generate the modulated light as the optical signal, and the second section is a passive section including a wavelength control section.

In one embodiment, the optical transmitter further includes a controller configured to: generate the first control signal adapted to adjust a temperature of the first heater based on timing of the burst period; generate the second control signal regardless of the timing of the burst period; and provide the generated first and second control signals to the first and second heaters, respectively.

In one embodiment, the optical transmitter further includes a controller configured to: generate the first control signal adapted to adjust a temperature of the first heater based on timing of the burst period, the first control signal having a first level during a first period in response to on timing of the burst period and a second level during a second period in response to off timing of the burst period, the first level being lower than the second level; and generate the second control signal adapted to adjust temperature of the second heater based on the timing of the burst period, the second control signal having a third level during a third period in response to said on timing of the burst period and a fourth level during a fourth period in response to said off timing of the burst period, the third level being lower than the fourth level, and wherein a difference between the first and second levels is greater than a difference between the third and fourth levels, or the first period is longer than the third period.

In one embodiment, the optical transmitter further includes a controller configured to: generate a wavelength control signal adapted for adjusting a lasing wavelength of the light source; generate the first control signal regardless of the wavelength control signal; and generate the second control signal adapted to adjust a temperature of the second heater based on the wavelength control signal.

In one embodiment, the second control signal is adapted to decrease the temperature of the second heater when the wavelength control signal is adjusted to decrease the lasing wavelength, and the second control signal is adapted to increase the temperature of the second heater when the wavelength control signal is adjusted to increase the lasing wavelength.

In one embodiment, the controller reads a lookup table stored in memory to obtain the first level and the first period to generate the first control signal.

In one embodiment, the light source is a tunable laser source, and the lasing cavity further includes a third section, and the first section is a gain section, the second section is a wavelength control section, and the third section is a phase control section.

In one embodiment, the wavelength control section comprises one or more optical gratings.

In another aspect there is provided a control system for an optical transmitter including a light source. A lasing cavity of the light source includes an active gain section and a passive section including a wavelength control section. The system includes at least one processor comprising hardware. The at least one processor is configured to: receive an electrical data signal with a burst period; generate a first control signal adapted to adjust a temperature of a first heater thermally coupled to the active gain section based on timing of the burst period; generate a second control signal regardless of the timing of the burst period; and provide the first control signal and the second control signal to the first heater and a second heater thermally coupled to the passive section, respectively.

In one embodiment, the at least one processor is further configured to: generate a wavelength control signal adapted for adjusting a lasing wavelength of the light source; generate the first control signal regardless of the wavelength control signal; and generate the second control signal adapted to adjust a temperature of the second heater based on the wavelength control signal.

In one embodiment, the second control signal is adapted to decrease the temperature of the second heater when the wavelength control signal is adjusted to decrease the lasing wavelength, and the second control signal is adapted to increase the temperature of the second heater when the wavelength control signal is adjusted to increase the lasing wavelength.

In one embodiment, the at least one processor is configured to generate the first control signal having a first level during a first period in response to on timing of the burst period and a second level during a second period in response to off timing of the burst period, the first level being lower than the second level.

In still another aspect there is provided a method for controlling an optical transmitter. The method includes emitting an optical signal using a light source. A lasing cavity of the light source includes a first section and a second section. The method further includes performing, by a first heater thermally coupled to the first section, a first temperature control on the first section using a first control signal; and performing, by a second heater thermally coupled to the second section, a second temperature control on the second section using a second control signal. The first temperature control is independent from the second temperature control.

In one embodiment, the light source is configured to emit the optical signal during a burst period of an electrical data signal, and wherein the first section is an active gain section configured to modulate light of the light source according to the electrical data signal and generate the modulated light as the optical signal, and the second section is a passive section including a wavelength control section.

In one embodiment, the method further includes generating, by a controller, the first control signal adapted to adjust a temperature of the first heater based on timing of the burst period; generating, by the controller, the second control signal regardless of the timing of the burst period; and providing, by the controller, the generated first and second control signals to the first and second heaters, respectively.

In one embodiment, the method further includes generating, by a controller, the first control signal adapted to adjust a temperature of the first heater based on timing of the burst period, the first control signal having a first level during a first period in response to on timing of the burst period and a second level during a second period in response to off timing of the burst period, the first level being lower than the second level.

In one embodiment, the method further includes generating, by the controller, the second control signal adapted to adjust a temperature of the second section based on timing of the burst period, the second control signal having a third level during a third period in response to said on timing of the burst period and a fourth level during a fourth period in response to said off timing of the burst period, the third level being lower than the fourth level, and wherein a difference between the first and second levels is greater than a difference between the third and fourth levels, or the first period is longer than the third period.

In one embodiment, the method further includes: generating, by a controller, a wavelength control signal adapted for adjusting a lasing wavelength of the light source; generating, by the controller, the first control signal regardless of the wavelength control signal; and generating, by the controller, the second control signal adapted to adjust a temperature of the second heater based on the wavelength control signal.

In one embodiment, the second control signal is adapted to decrease the temperature of the second heater when the wavelength control signal is changed to decrease the lasing wavelength, and the second control signal is adapted to increase the temperature of the second heater when the wavelength control signal is changed to increase the lasing wavelength.

BRIEF DESCRIPTION OF THE DRAWINGS

FIG. 2A depicts an example burst data stream to be modulated by a laser according to a non-limiting exemplary embodiment of the present disclosure;

FIG. 2B depicts an example burst-mode (BM) information signal according to a non-limiting exemplary embodiment of the present disclosure;

FIG. 2C depicts an example first heat control signal according to a non-limiting exemplary embodiment of the present disclosure;

FIG. 2D depicts an example second heat control signal according to a non-limiting exemplary embodiment of the present disclosure;

FIG. 2E depicts an example third heat control signal according to a non-limiting exemplary embodiment of the present disclosure;

FIG. 3A depicts an example wavelength control current according to a non-limiting exemplary embodiment of the present disclosure;

FIG. 3B depicts an example first heat control signal according to a non-limiting exemplary embodiment of the present disclosure;

FIG. 3C depicts an example second heat control signal according to a non-limiting exemplary embodiment of the present disclosure;

FIG. 3D depicts an example third heat control signal according to a non-limiting exemplary embodiment of the present disclosure;

DETAILED DESCRIPTION OF THE EMBODIMENTS

Embodiments of the present disclosure will now be described in detail on the basis of the drawings. However, the following embodiments do not restrict the invention claimed in the claims. Moreover, all combinations of features described in the embodiments are not necessarily mandatory for the architecture of the present system and methods. Like numbers are assigned to like elements throughout the description of the embodiments of the present disclosure.

It will be understood that, although the terms first, second, third, etc. may be used herein to describe various elements. Locations of these elements or orders where the elements are arranged should not be limited by these terms. Instead, these terms are only used to distinguish one element from another element.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

A laser temperature compensation method according to the present invention allows a system to perform more precise temperature control on a laser with a multi-sectioned lasing cavity. To this end, the optical transmitter according to the present invention includes a plurality of heaters. Each of the heaters is configured to perform a temperature control on a corresponding one of the plurality of sections of the lasing cavity. Use of the different heaters to a respective of the plurality of sections enables independent temperature controls on the multi-sections of the lasing cavity. In one embodiment, one section can thermally be insulated from another section, and thus, a temperature control on one section does not affect the temperature of another section.

Figure 1:
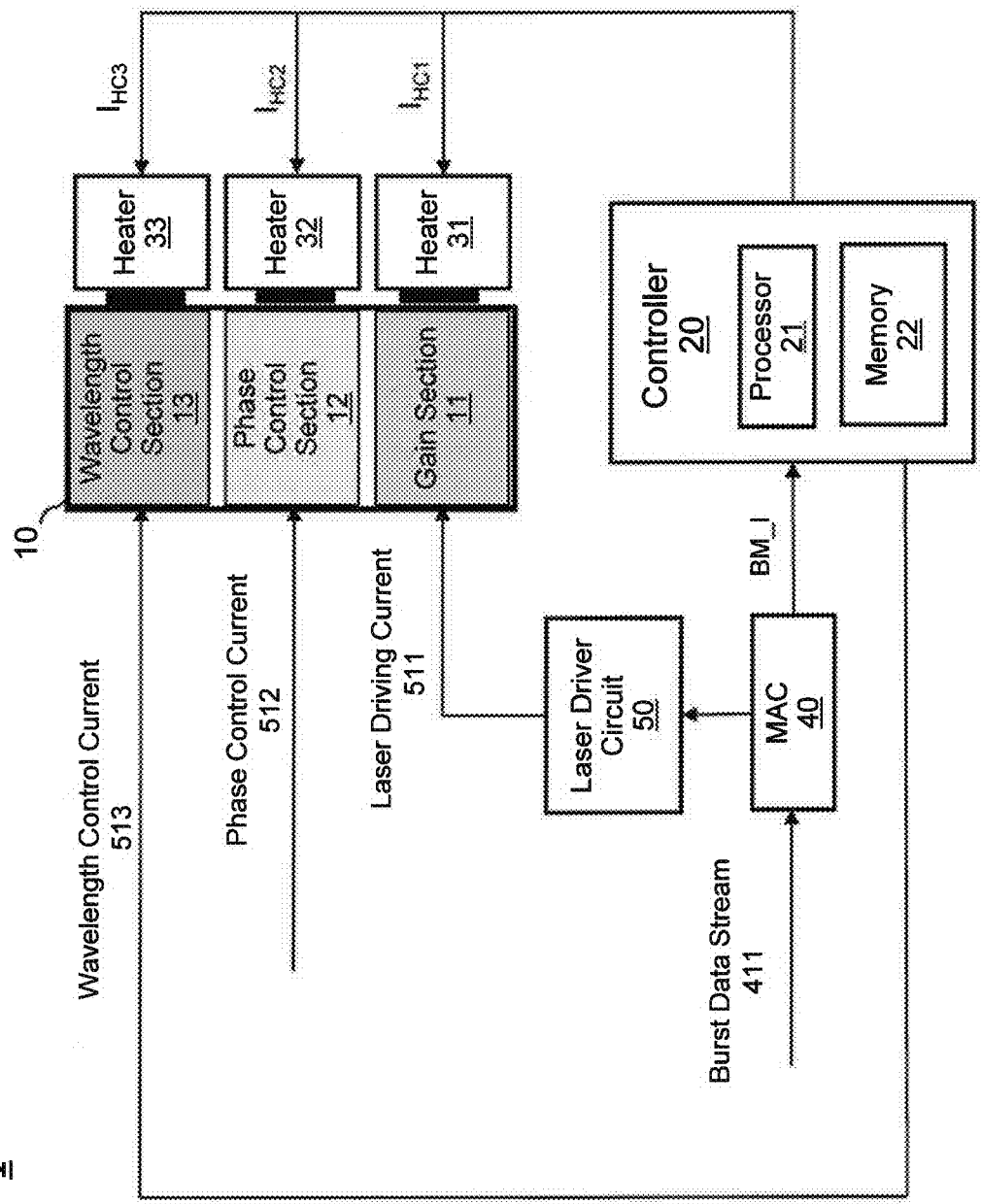
FIG. 1 depicts an example optical transmitter according to a non-limiting exemplary embodiment of the present disclosure.

FIG. 1 depicts an example optical transmitter 1 according to a non-limiting exemplary embodiment of the present disclosure. Referring now to FIG. 1, the optical transmitter 1 includes a laser source 10, a plurality of heaters 31 to 33, a controller 20, a laser driver 50, and a medium access control (MAC) device 40.

As shown in FIG. 1, the lasing cavity of the laser source 10 can be divided into a plurality of sections such as a gain section 11, a phase control section 12, and a wavelength control section 13. Each of the heaters 31 to 33 is thermally coupled to a corresponding one of the gain section 11, the phase control section 12, and the wavelength control section 13 to perform a temperature control on the corresponding section by a control by the controller 20. For example, the controller 20 provides a first heat control signal $I_{HC1}$ to the first heater 31, provides a second heat control signal $I_{HC2}$ to the second heater 32, and provides a third heat control signal $I_{HC3}$ to the third heater 33, so that the heaters 31 to 33 can independently perform temperature controls on the plurality of sections 11 to 13, respectively. More details as to how the heat control signals $I_{HC1}$ to $I_{HC3}$ are changed to the temperature compensation for the respective multiple sections of the laser 10 will be described later with reference to FIGS. 2A-2E and 3A-3D. In one embodiment, the laser 10 can be implemented with a wavelength tunable semiconductor laser such as a distributed Bragg reflector (DBR) based tunable lasers, details of which will be described with reference to FIGS. 4A-4C.

The MAC device 40 receives a message including a burst data stream 411 (see FIG. 2A) from other higher protocol layers. The burst data stream 411 may be data for being modulated by the optical transmitter 1 and transmitted over an optical link. The MAC device 40 provides the burst data stream 411 to the laser driver 50. The laser driver 50 generates a laser driving current 511 based on the burst data stream 411 and provides the laser driving current 511 to the gain section 11 of the laser source 10 as a laser modulation current. In one embodiment, the laser driving current 511 may include an AC modulation current and a DC bias current. Referring further to FIG. 2A, the MAC device 40 generates a burst-mode (BM) information signal BM_I based on the burst data stream 411 to provide the generated BM information signal BM_1 to the controller 20. As exemplarily illustrated in FIG. 2A, the BM information signal BM_I turns to a high level (e.g., activated) when the burst data stream 411 starts, and turns to a low level (e.g., deactivated) when the burst data stream 411 ends. The burst data stream 411 can be interchangeable with the term "burst mode data (signal)". A period where the burst data stream 411 is received is referred to as a "burst period".

In the gain section 11 of the lasing cavity, light is generated and directly modulated according to the laser driving current 511 driven by the laser driver 50. The lasing wavelength of the laser 10 is tuned through the wavelength control section 13. For example, sampled Bragg gratings or reflectors are used as a mean(s) for defining the output lasing wavelength of a laser. The controller 20 or other separate control system (not shown) can provide a wavelength control current 513 to the wavelength control section 13, for example, upon a demand for a wavelength switching to another channel in a wavelength-division multiplexing (WDM) optical link length division.

In addition, in the phase control section 12, a cavity length of the laser 10 is finely adjusted according to a phase control current 512 so as to match the lasing wavelength, so that stable lasing can be achieved. In an example, the phase control current 512 can be feedback from a multichannel spectral filter (not shown) that may be placed at the output of the optical transmitter 1 to filter a corresponding lasing wavelength. In another example, the phase control current 512 can be provided from the controller 20.

In one embodiment, the multiple sections 11 to 13 constituting the lasing cavity of the laser 10 are made of different materials or different combinations or structures of the materials. For example, the gain section 11 has a multi quantum well structure made of InGaAsP or InAlGaAs, the phase control section 12 is made of bulk InAlGaAs, and the wavelength control section 13 is configured to have a grating section with a heterostructure made of InP/InGaAsP/InP. Although it is illustrated in figures that the lasing cavity of a laser includes at least three multiple sections, exemplary embodiments of the present disclosure are not limited thereto. For example, the number of sections in the lasing cavity can be two or more.

It will be appreciated that the wavelength control section 13 and the phase control section will collectively be denoted "Passive" sections, since they are not active in the sense that they do not contribute to any gain in the laser light, compared to the gain section 11 which actively serves as a gain to generate the laser light.

In general, if a certain amount of current is applied to a section of the lasing cavity, the corresponding section is heated (e.g., temperature increases). For example, as the current being applied to the corresponding section of the lasing cavity gets higher, temperature of the section gets higher, or vice versa.

It is conceivable that there are various laser heat generation events including, but are not limited: a heat generation event where the temperature of a laser varies according to whether a burst data stream (e.g., 411) is received and a heat generation event where the temperature of a laser varies according to whether a wavelength tuning of the laser occurs.

Regarding the heat generation event where the temperature of a laser varies according to whether the burst data stream is received, considering that the gain section 11 serves as a medium to directly modulate light based on the laser driving current 511 and the laser driving current 511 gets higher when the burst data stream 411 is received, or vice versa, the receipt of the burst data stream 411 may dominantly effect on heating of the gain section 11 rather than other sections 12 and 13. For example, when the burst data stream 411 is received, the laser driving current 511 gets higher, and thus, the temperature of the gain section 11 increases. In addition, when the burst data stream 411 is not received, the laser driving current 511 gets lower (e.g., AC current of the laser driving current becomes zero), and thus, the temperature of the gain section 11 decreases. Since the laser driving current 511 is not applied to other sections such as the phase control section 12 and the wavelength control section 13, the temperature variation of each section 12 and 13 caused by the receipt of the burst data stream 411 is relatively low compared to the gain section 11, or negligible.

Further, regarding the above heat generation event where the temperature of a laser varies according to whether the burst data stream is received, the controller 20 generates the first heat control signal $I_{HC1}$ for controlling a temperature of the first heater 31. The first heat control signal $I_{HC1}$ is adapted to adjust the temperature of the first heater 31 based on whether the burst data stream is received, thus compensating for the temperature variation of the gain section 11 to ensure that the entire temperature of a laser (e.g., 10) is maintained regardless of whether the burst data stream 411 is received and a laser thermal chirp is thus mitigated. In one embodiment, the controller 20 determines receipt of the burst data stream 411 based on the BM information signal BM_I and generates the first heat control signal $I_{HC1}$, a level of which varies in a complementary manner to the BM information signal BM_I, as shown in FIG. 2C. As an example, in response to the BM information signal BM_I turning to a high level, the first heat control signal $I_{HC1}$ turns to a low level; and in response to the BM information signal BM_I turning to a low level, the first heat control signal $I_{HC1}$ turns to a high level. In other words, the first heater 31 is controlled to be decreased using the first heat control signal $I_{HC1}$ during a burst period of the burst data stream 411, and is controlled to be maintained using the first heat control signal $I_{HC1}$ during other periods than the burst period.

In this case, for example, a period (e.g., $\Delta t_{1BL}$ of FIG. 2C) when the first heat control signal $I_{HC1}$ is at a low level can be equal to the burst period of the burst data stream 411. However, embodiments of the present disclosure are not limited thereto. In another example, the period $\Delta t_{1BL}$ when the first heat control signal $I_{HC1}$ is at the low level, and/or a starting or ending time points of the period $\Delta t_{1BL}$ can be adjusted based on a thermal conductivity of the gain section 11; e.g., if the thermal conductivity increases, the period $\Delta t_{1BL}$ at a low level may be decreased, or vice versa. The thermal conductivity of the gain section 11 may vary depending on materials or structure thereof (e.g., a multi quantum well structure made of InGaAsP or InAlGaAs). Information regarding the length of the low level period $\Delta t_{1BL}$ of the first heat control signal $I_{HC1}$, the starting or ending time points of the low level period $\Delta t_{1BL}$, and/or high or low levels of the first heat control signal $I_{HC1}$ can be defined in consideration of the thermal conductivity of the gain section 11 and are stored in a lookup table (not shown) of the memory 22 or other external storage device. And, a processor 21 of the controller 20 may read the lookup table from the memory 22 to determine corresponding parameters with respect to the gain section 11. In some embodiments, the controller 20 generates the first heat control signal $I_{HC1}$ to turn off the first heater 31 to decrease the temperature thereof during the period $\Delta t_{1BL}$.

Further, in one embodiment, the controller 20 generates the second heat control signal $I_{HC2}$ and/or the third heat control signal $I_{HC3}$ regardless of the timing of the burst period of the burst data stream 411. As explained above, only the gain section 11 is directly applied with the laser driving current 511 whose level varies according to whether the burst data stream 411 is received, while temperatures of other sections 12 and 13 are not directly affected by the driving current 511. Thus, in one embodiment, the second heat control signal $I_{HC2}$ and/or the third heat control signal $I_{HC3}$ may remain constant regardless of the timing of the burst period, as exemplarily illustrated in FIGS. 2D and 2E.

However, although not shown in figures, in some embodiments, the second heat control signal $I_{HC2}$ and/or the third heat control signal $I_{HC3}$ can also be adapted to adjust the temperature of the phase control section 12 and/or the wavelength control section 13, respectively, based on the timing of the burst period. In this case, the second heat control signal $I_{HC2}$ (or the third heat control signal $I_{HC3}$) is generated such that its level varies in a complementary manner to the BM information signal BM_I, as similar to the first heat control signal $I_{HC1}$. However, a variation of the second heat control signal $I_{HC2}$ (or the third heat control signal $I_{HC3}$) depending on the timing of the burst period is smaller than that of the first heat control signal $I_{HC1}$. In other words, a difference between high and low levels of the first heat control signal $I_{HC1}$ may be greater than a difference between high and low levels of the second heat control signal $I_{HC2}$ (or the third heat control signal $I_{HC3}$). In addition, the low level period $\Delta t_{1BL}$ of the first heat control signal $I_{HC1}$ may be longer than a low level period of the second heat control signal $I_{HC2}$ (or the third heat control signal $I_{HC3}$).

Regarding the heat generation event where the temperature of a laser varies according to whether a wavelength tuning occurs, it is further conceivable that the wavelength control section 13 serves as a medium to tune a lasing wavelength by adjusting the wavelength control current 513 provided by the controller 20 and the wavelength control current 513 is applied to the wavelength control section 13 while it is not applied to the gain section 11 and the phase control section 12. Further, the phase control section 12 serves as a medium to control the phase of lasing light of the light source 10. Thus, when the above wavelength tuning takes place, a relatively small amount of the phase control current 512 can be applied to the phase control section 12 for slightly adjusting the laser cavity length, so the lasing wavelength is matched.

In addition, in order to tune the lasing wavelength of the laser 10, the wavelength control current 513 is adjusted. For example, if the wavelength control current 513 increases (e.g., by 0.5 mA), the lasing wavelength moves toward a shorter wavelength (e.g., by 0.1 nm), or vice versa. Thus, when the lasing wavelength is tuned to get shorter, the wavelength control current 513 gets higher to generate heat on the wavelength control section 13, or vice versa. On the other hand, the laser driving current 511 applied to the gain section 11 does not depend on occurrence of the wavelength tuning, and thus the temperature variation may not occur in the gain section 11 caused by the wavelength tuning.

Thus, in order to compensate for the temperature variation caused by the wavelength turning, the controller 20 controls the temperature of the third heater 33 using the third heat control signal $I_{HC3}$ to be adjusted according to whether the wavelength tuning occurs, thus ensuring that the entire temperature of a laser (e.g., 10) is maintained regardless of whether the wavelength tuning occurs and a laser thermal chirp is thus mitigated. For example, the third heat control signal $I_{HC3}$ is generated such that its level varies in a complementary manner to the variation of the wavelength control current 513, as shown in FIG. 3D, whereas the first heat control signal $I_{HC1}$ and/or the second heat control signal $I_{HC2}$ are generated regardless of the variation of the wavelength control current 513, as shown in FIGS. 3B and 3C.

Referring further to FIG. 3A illustrating an example wavelength control current 513 applied to the wavelength control section 13, the wavelength control current 513 may start increasing at a time $t_{ws}$ to tune the lasing wavelength toward a shorter wavelength, upon an input from a system operator or program commands stored in the memory 22, remain at a certain current level for a period upon the wavelength reaches a target value, and start decreasing at a time $t_{we}$ upon another input to tune the lasing wavelength toward a longer wavelength. Practically, such wavelength tuning is frequently demanded in a WDM optical network system. For example, when the wavelength tuning occurs, the third heat control signal $I_{HC3}$ is adapted to be increased or decreased according to whether the wavelength tuning is made toward a shorter wavelength or a longer wavelength. Upon determining that the lasing wavelength is tuned toward the shorter wavelength, the third heat control signal $I_{HC3}$ is decreased to control the temperature of the third heater 33 to be decreased. In some embodiments, the third heater 33 may be turned off to decrease the temperature of the third heater 33. In addition, upon determining that the lasing wavelength is tuned toward a longer wavelength, the third heat control signal $I_{HC3}$ is increased to control the temperature of the third heater 33 to be increased.

Figures 4A, 4B, 4C:
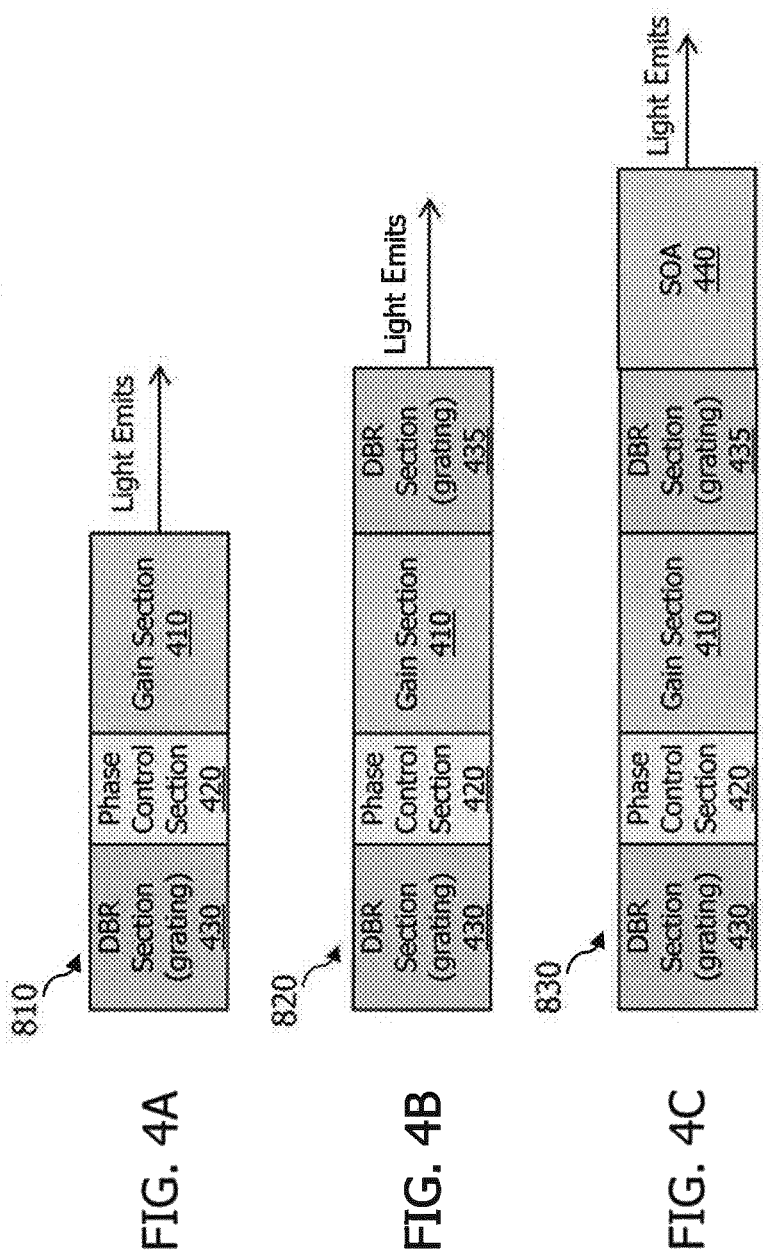
FIGS. 4A-4C illustrate DBR type-wavelength tunable laser sources that can be used in an optical transmitter according to a non-limiting exemplary embodiment of the present disclosure.

FIGS. 4A to 4C illustrate DBR type-wavelength tunable laser sources that can be used in an optical transmitter according to a non-limiting exemplary embodiment of the present disclosure.

Referring to FIG. 4A, a DBR laser 810 is implemented to have a lasing cavity with three sections: a DBR section with sampled gratings 430, a phase control section 420 and a gain section 410. In addition, a DBR laser 820 shown in FIG. 4B further includes a rear DBR section 435 after the gain section 410 along a light emission direction in addition to the structure of the DBR laser 810 of FIG. 4A.

Referring further to FIG. 4C, a DBR laser 830 further includes a semiconductor optical amplifier (SOA) 440 after the rear DBR section 435 along a light emission direction in addition to the structure of the DBR laser 820 of FIG. 4B.

Figure 5:
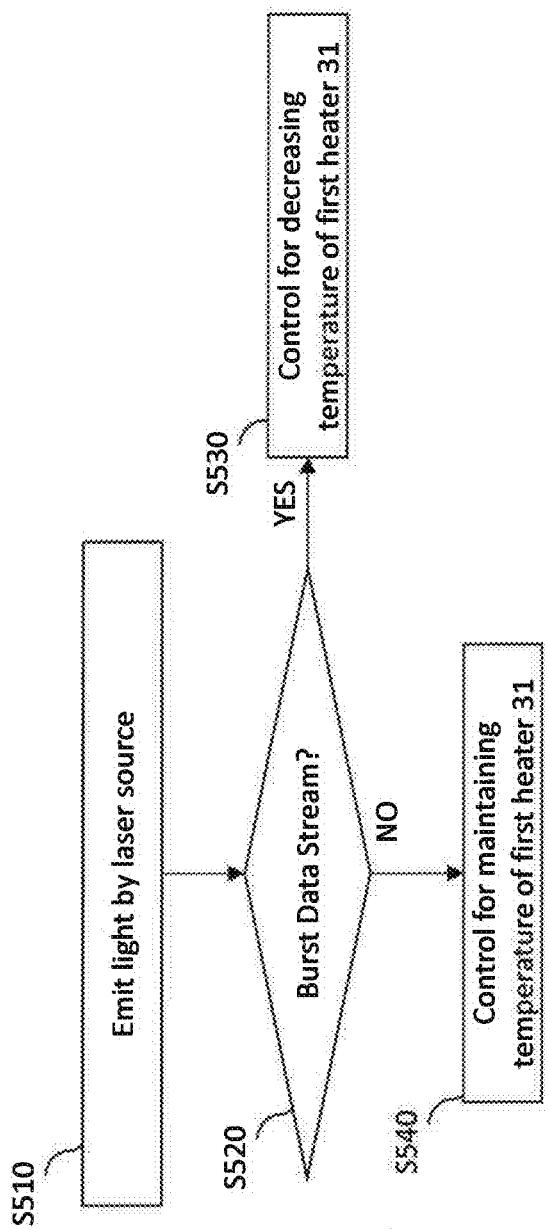
FIGS. 5-7 are flow charts illustrating methods for controlling an optical transmitter to compensate for temperature variation of a laser caused by receipt of a burst data stream and/or a wavelength tuning, according to a non-limiting exemplary embodiment of the present disclosure.
Figure 6:
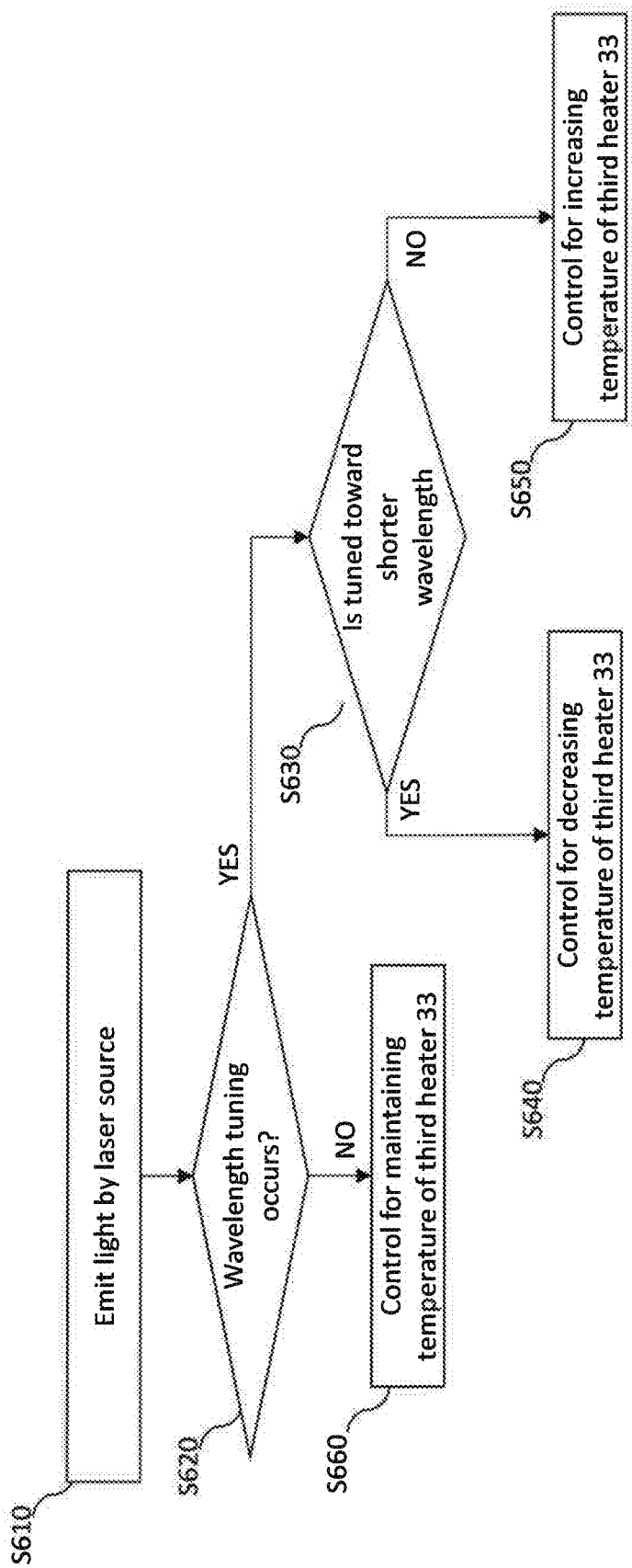
Figure 7:
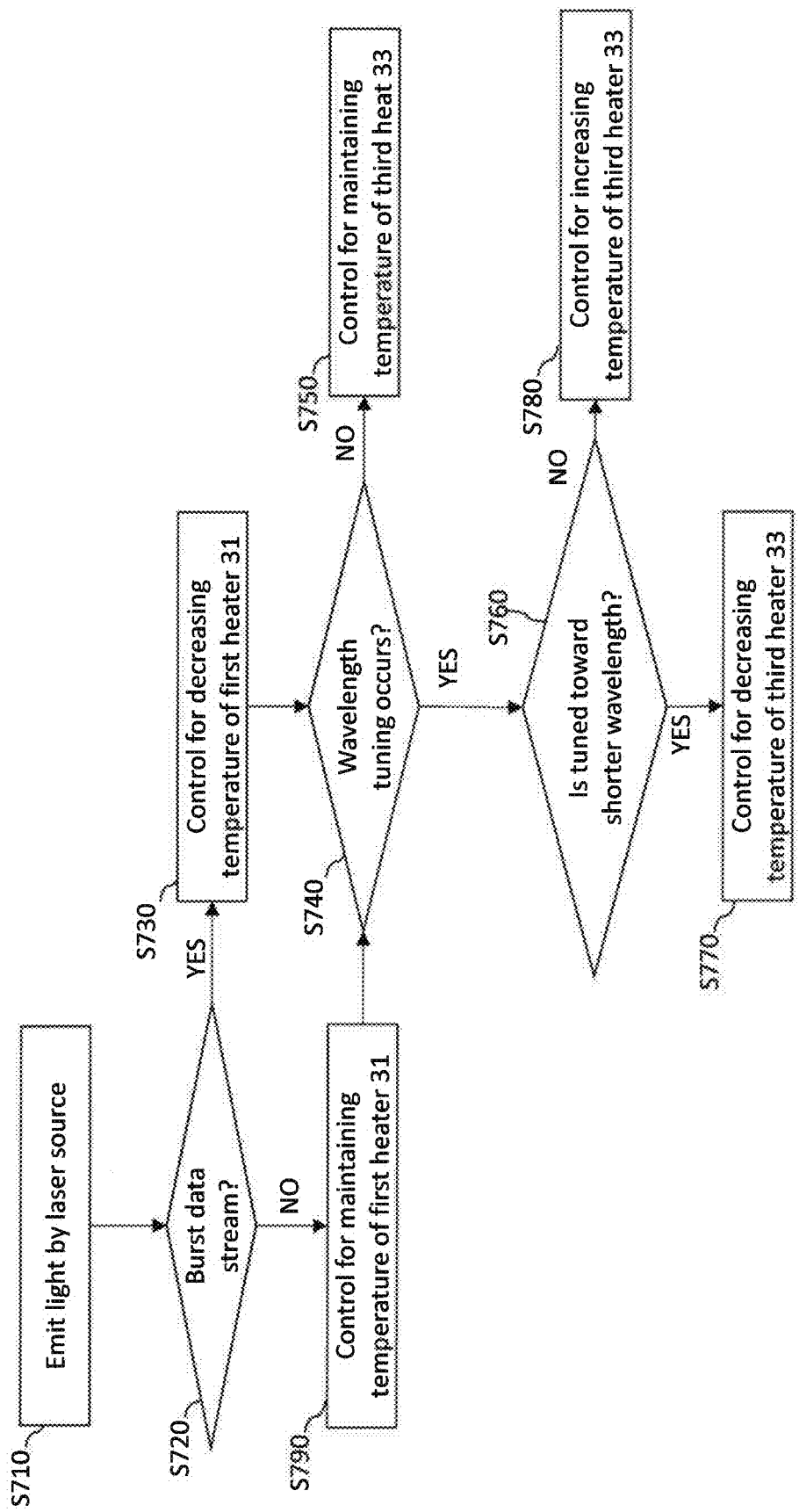

FIGS. 5-7 are flow charts illustrating a method for controlling an optical transmitter to compensate for the temperature variation of a laser caused by receipt of a burst data stream and/or wavelength tuning operation according to a non-limiting exemplary embodiment of the present disclosure.

Referring now to FIGS. 1, 2A-2E, 3A-3D and 5, the controller 20 can monitor the receipt of the burst data stream 411 based on the BM information signal BM_I. In addition, in response to occurring of a wavelength tuning, the controller 20 increases or decreases the wavelength control current 513 for tuning the lasing wavelength of the laser source 10.

In step S510, the laser source 10 emits light, intensity of which may be modulated according to the laser driving current 511 when the burst data stream 411 is received. Next, the controller 20 determines whether the burst data stream 411 is received (S520).

When the burst data stream 411 is received (YES), the controller 20 controls the temperature of the first heater 31 using the first heat control signal $I_{HC1}$ to be decreased during a burst period of the burst data stream 411, thus compensating for the heating of the gain section 11 caused by the receipt of the burst data stream 411 (S530). To this end, in one embodiment, the first heat control signal $I_{HC1}$ is adapted to vary in a complementary manner to the burst period; for example, the first heat control signal $I_{HC1}$ is at a low level during the burst period and is at a high level during other periods than the burst period. In some embodiments, the first heater 31 can be turned off to decrease the temperature of the first heater 31 during the burst period and can be turned on during the other periods than the burst period. In addition, when no burst data stream 411 is received (NO), the controller 20 controls the temperature of the first heater 31 using the first heat control signal $I_{HC1}$ to be maintained (S540).

Referring now to FIGS. 1, 2A-2E, 3A-3D and 6, in step S610, the laser source 10 emits light, intensity of which may be modulated according to the laser driving current 511 when the burst data stream 411 is received. The controller 20 determines whether a wavelength tuning occurs (S620).

When the wavelength tuning occurs (YES), the controller 20 further determines whether the wavelength tuning is made toward a shorter wavelength (S630). Upon determining that the lasing wavelength is tuned toward the shorter wavelength (YES), the controller 20 controls the temperature of the third heater 33 using the third heat control signal $I_{HC3}$ to be decreased, thus compensating for the heating of the wavelength control section 13 caused by the increased wavelength control current 513 (S640). To this end, in one embodiment, the third heat control signal $I_{HC3}$ is decreased to a low level until a next wavelength tuning event occurs. In some embodiments, the third heater 33 can be turned off to decrease the temperature of the third heater 33. In addition, upon determining that the lasing wavelength is tuned toward a longer wavelength (NO), the controller 20 controls the temperature of the third heater 33 using the third heat control signal $I_{HC3}$ to be increased, thus compensating for the temperature drop of the wavelength control section 13 caused by the decreased wavelength control current 513 (S650). In addition, when no wavelength tuning occurs (NO), the controller 20 controls the temperature of the third heater 33 using the third heat control signal $I_{HC3}$ to be maintained (S660).

Referring now to FIGS. 1, 2A-2E, 3A-3D and 7, illustrated is a flow chart for an optical transmitter control method, considering both receipt of the burst data stream and occurrence of the wavelength tuning. In step S710, the laser source 10 emits light, intensity of which may be modulated according to the laser driving current 511 when the burst data stream 411 is received.

In step S720, the controller 20 determines whether the burst data stream 411 is received. When the burst data stream 411 is received (YES), the controller 20 controls the temperature of the first heater 31 using the first heat control signal $I_{HC1}$ to be decreased during a burst period of the burst data stream 411, thus compensating for the heating of the gain section 11 caused by the receipt of the burst data stream 411 (S730). Next, in step S740, the controller 20 further determines whether a wavelength tuning occurs. When the wavelength tuning occurs (YES), the controller 20 further determines whether the wavelength tuning moves toward a shorter wavelength (S760). Upon determining that the lasing wavelength is tuned toward the shorter wavelength (YES), the controller 20 controls the temperature of the third heater 33 using the third heat control signal $I_{HC3}$ to be decreased (S770). In addition, upon determining that the lasing wavelength is tuned toward a longer wavelength (NO), the controller 20 controls the temperature of the third heater 33 using the third heat control signal $I_{HC3}$ to be increased (S780). Back to the step S720, when no burst data stream 411 is received (NO), the controller 20 controls the temperature of the first heater 31 to be maintained (S790), and the method goes to step S740 and repeats steps S750 to S780.

In one embodiment, the multiple sections (e.g., gain section 11, phase control section 12 and/or wavelength control section 13) have different thermal conductivities one from another according to materials and/or structures by which they are made of. Thus, even if the multiple sections are heated substantially equally due to at least any one of heat generation events including receipt of a burst data stream and occurrence of a wavelength tuning, reactions of the sections to the supplied heating may be different one from another. For example, the higher the thermal conductivity of a section is, the faster the temperature of the section varies, or vice versa. Thus, for a more precise temperature control, the heaters 31 to 33 thermally coupled to the respective multiple sections 11 to 13 are independently controlled based on the different thermal conductivities, so that the temperature of the entire laser can be maintained.

By way of example only, the thermal conductivity of a material depends on how many elements are combined to form it; e.g., the higher the number of elements, the lower the thermal conductivity, and thus, the thermal conductivity of a ternary compound material (e.g., InGaAs, InAlAs) is lower than a binary compound material (e.g., InP) and is higher than a quaternary compound material (e.g., InGaAsP, InAlGaAs).

Thus, in one embodiment, if the thermal conductivity of a first section of the lasing cavity is higher than a second section thereof, the range of variation in level or time of a heat control signal (associated with the first section) for the laser temperature compensation can be lower or shorter than another heat control signal (associated with the second section). However, embodiments of the present disclosure are not limited thereto.

Figure 8:
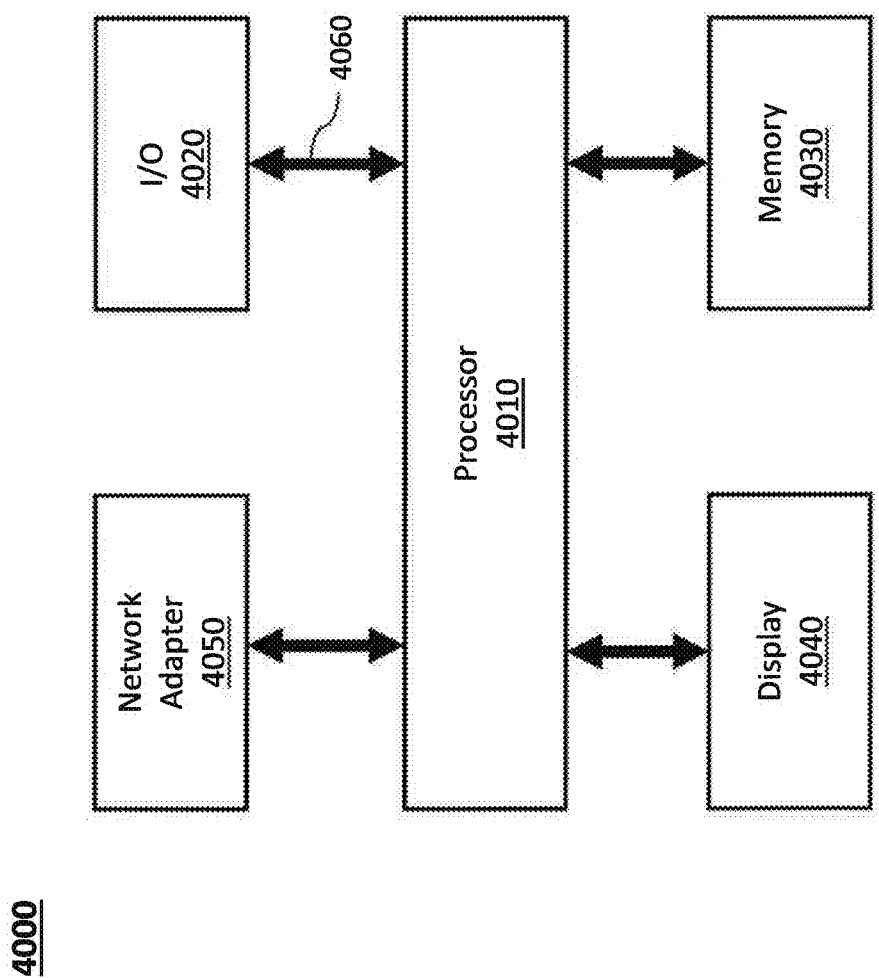
FIG. 8 is a block diagram of a computing system according to a non-limiting exemplary embodiment of the present disclosure.

FIG. 8 is a block diagram of a computing system 4000 according to a non-limiting exemplary embodiment of the present disclosure.

Referring to FIG. 8, the computing system 4000 may be used as a platform for performing the functions or operations described hereinabove with respect to the optical transmitter 1 of FIG. 1 and/or the methods of FIGS. 5-7.

Referring to FIG. 8, the computing system 4000 may include a processor 4010, I/O devices 4020, a memory system 4030, a display device 4040, and a network adaptor 4050.

The processor 4010 may drive the I/O devices 4020, the memory system 4030, the display device 4040, and the network adaptor 4050 through a bus 4060.

The computing system 4000 may include a program module for performing the functions or operations described hereinabove with respect to the optical transmitter 1 of FIG. 1 and/or the methods of FIGS. 5-7 according to exemplary embodiments. For example, the program module may include routines, programs, objects, components, logic, data structures, or the like, for performing particular tasks or implement particular abstract data types. The processor (e.g., 4010) of the computing system 4000 may execute instructions written in the program module to perform the functions or operations described with respect to the optical transmitter 1 of FIG. 1 and/or the methods of FIGS. 5-7. The program module may be programmed into the integrated circuits of the processor (e.g., 4010). In an exemplary embodiment, the program module may be stored in the memory system (e.g., 4030) or in a remote computer system storage media.

The computing system 4000 may include a variety of computing system readable media. Such media may be any available media that is accessible by the computer system (e.g., 4000), and it may include both volatile and non-volatile media, removable and non-removable media.

The memory system (e.g., 4030) can include computer system readable media in the form of volatile memory, such as RAM and/or cache memory or others. The computer system (e.g., 4000) may further include other removable/non-removable, volatile/non-volatile computer system storage media.

The computer system (e.g., 4000) can communicate with one or more devices using the network adapter (e.g., 4050). The network adapter may support wired communications based on Internet, local area network (LAN), wide area network (WAN), or the like, or wireless communications based on code division multiple access (CDMA), global system for mobile communication (GSM), wideband CDMA, CDMA-2000, time division multiple access (TDMA), long term evolution (LTE), wireless LAN, Bluetooth, or the like.

Exemplary embodiments of the present disclosure may include a system, a method, and/or a computer program product. The computer program product may include a non-transitory computer readable storage medium (e.g., the memory system 4030) having computer readable program instructions thereon for causing a processor to carry out aspects of the present disclosure.

The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, or the like, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to the computing system 4000 from the computer readable storage medium or to an external computer or external storage device via a network. The network may include copper transmission cables, optical transmission fibers, wireless transmission, routers, firewalls, switches, gateway computers and/or edge servers. A network adapter card (e.g., 4050) or network interface in each computing/processing device receives computer readable program instructions from the network and forwards the computer readable program instructions for storage in a computer readable storage medium within the computing system.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the computing system (e.g., 4000) through any type of network, including a LAN or a WAN, or the connection may be made to an external computer (for example, through the Internet using an Internet Service Provider). In an exemplary embodiment, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, device, and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description but is not intended to be exhaustive or limited to the present disclosure in the form disclosed. Many modifications and variations will be apparent to those of ordinary skill in the art without departing from the scope and spirit of the present disclosure. The embodiment was chosen and described in order to best explain the principles of the present disclosure and the practical application, and to enable others of ordinary skill in the art to understand the present disclosure for various embodiments with various modifications as are suited to the particular use contemplated.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated but fall within the scope of the appended claims.

What is claimed is:

1. An optical transmitter, comprising:
   a semiconductor multi-section laser light source configured to emit an optical signal, a lasing cavity of the semiconductor multi-section laser light source including a first section and a second section;

a first heater thermally coupled to the first section and configured to perform a first temperature control on the first section using a first control signal; and a second heater thermally coupled to the second section and configured to perform a second temperature control on the second section using a second control signal; and a controller configured to:
  generate a wavelength control signal adapted for adjusting a lasing wavelength of the semiconductor multi-section laser;
  generate the first control signal regardless of the wavelength control signal; and
  generate the second control signal adapted to adjust a temperature of the second heater based on the wavelength control signal, wherein the first temperature control is independent from the second temperature control, wherein the semiconductor multi-section laser is configured to emit the optical signal during a burst period of an electrical data signal, wherein the first section is an active gain section configured to modulate light of the semiconductor multi-section laser according to the electrical data signal and generate the modulated light as the optical signal, and the second section is a passive section comprising a wavelength control section, and wherein the second control signal is adapted to decrease the temperature of the second heater when the wavelength control signal is adjusted to decrease the lasing wavelength, and the second control signal is adapted to increase the temperature of the second heater when the wavelength control signal is adjusted to increase the lasing wavelength.

2. The optical transmitter of claim 1, wherein the controller is further configured to:
  generate the first control signal adapted to adjust a temperature of the first heater based on timing of the burst period;
  generate the second control signal regardless of the timing of the burst period; and
  provide the generated first and second control signals to the first and second heaters, respectively.

3. The optical transmitter of claim 1, wherein the controller is further configured to:
  generate the first control signal adapted to adjust a temperature of the first heater based on timing of the burst period, the first control signal having a first level during a first period in response to on timing of the burst period and a second level during a second period in response to off timing of the burst period, the first level being lower than the second level; and
  generate the second control signal adapted to adjust a temperature of the second heater based on the timing of the burst period, the second control signal having a third level during a third period in response to said on timing of the burst period and a fourth level during a fourth period in response to said off timing of the burst period, the third level being lower than the fourth level, and wherein a difference between the first and second levels is greater than a difference between the third and fourth levels, or the first period is longer than the third period.

4. The optical transmitter of claim 3, wherein the controller reads a lookup table stored in memory to obtain the first level and the first period to generate the first control signal.

5. The optical transmitter of claim 1, wherein the lasing cavity further includes a third section, and
  wherein the first section is a gain section, the second section is a wavelength control section, and the third section is a phase control section.

6. The optical transmitter of claim 1, wherein the wavelength control section comprises one or more optical gratings.

* * * * *